(12) United States Patent
Chiu et al.

(10) Patent No.: US 9,419,572 B2
(45) Date of Patent: Aug. 16, 2016

(54) AUDIO DEVICE AND AUDIO UTILIZATION METHOD HAVING HAPTIC COMPENSATION FUNCTION

(71) Applicant: REALTEK SEMICONDUCTOR CORPORATION, Hsinchu (TW)

(72) Inventors: Sheng-Nan Chiu, Hsinchu (TW); Chih-Jung Yu, Taichung (TW); Cheng-Pin Chang, Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 150 days.

(21) Appl. No.: 14/331,797

(22) Filed: Jul. 15, 2014

(65) Prior Publication Data

US 2015/0049882 A1 Feb. 19, 2015

(30) Foreign Application Priority Data

Aug. 19, 2013 (TW) .............................. 102129601 A

(51) Int. Cl.
*H03G 3/00* (2006.01)
*G06F 3/16* (2006.01)

(52) U.S. Cl.
CPC . *H03G 3/007* (2013.01); *G06F 3/16* (2013.01)

(58) Field of Classification Search
None
See application file for complete search history.

(56) References Cited

U.S. PATENT DOCUMENTS

| 6,703,550 | B2 | 3/2004 | Chu |
| 6,765,436 | B1 * | 7/2004 | Melanson et al. ............... 330/10 |
| 7,979,146 | B2 | 7/2011 | Ullrich et al. |
| 8,063,704 | B2 | 11/2011 | Wu et al. |
| 8,441,437 | B2 | 5/2013 | Rank |
| 2007/0145857 | A1 | 6/2007 | Cranfill et al. |
| 2011/0075835 | A1 | 3/2011 | Hill |
| 2012/0008796 | A1 * | 1/2012 | Furge ........................... 381/94.1 |
| 2012/0306631 | A1 | 12/2012 | Hughes |
| 2013/0293299 | A1 * | 11/2013 | Oh et al. ....................... 330/251 |

FOREIGN PATENT DOCUMENTS

TW 201010271 3/2010

OTHER PUBLICATIONS

J.M. Lim, J.U. Lee, K.U. Kyung, and J.C. Ryou, "An Audio-Haptic Feedbacks for enhancing User Experience in Mobile Devices", in 2013 IEEE International Conference on Consumer Electronics.
U.S. Pat. No. 7,979,146 is also published as EPO patent application EP2166432.

(Continued)

*Primary Examiner* — Thang Tran
(74) *Attorney, Agent, or Firm* — WPAT, P.C., Intellectual Property Attorneys; Anthony King

(57) ABSTRACT

The present invention discloses an audio device having haptic compensation function capable of compensating a haptic effect according to a power measuring result and an audio signal. An embodiment of the audio device comprises: an audio signal generating circuit operable to generate an audio signal; a power measuring circuit operable to measure a remaining electric quantity of a power source and thereby generate a power measuring result; and a haptic compensating circuit, coupled to the audio signal generating circuit and the power measuring circuit, operable to adjust a gain of the audio signal or the derived signal thereof according to the power measuring result and thereby output a haptic compensation signal which is used to compensate the haptic effect.

20 Claims, 5 Drawing Sheets

(56) References Cited

OTHER PUBLICATIONS

U.S. Pat. No. 8,441,437 is also published as PCT patent application WO2003032289.
US patent application 20070145857 is also published as PCT patent application WO2007078967.
US patent application 20110075835 is also published as EPO patent application EP2484104.
Office Action dated Mar. 20, 2015 issued by the Taiwan Office Action for corresponding Taiwan application 102129601.
U.S. Pat. No. 8,063,704 is the corresponding application for TW201010271.

* cited by examiner

US 9,419,572 B2

AUDIO DEVICE AND AUDIO UTILIZATION METHOD HAVING HAPTIC COMPENSATION FUNCTION

BACKGROUND OF THE INVENTION

1. Field of the Invention

The present invention relates to an audio device and audio utilization method, especially to an audio device and audio utilization method capable of haptic compensation.

2. Description of Related Art

Recently, in order to enhance user experience, many products adopt haptic design such as the vibration feedback of a game stick, the haptic feedback of a touch panel and the haptic function of a medical or learning device. Among a variety of haptic designs, some haptic design is applicable to audio products; for instance, when playing music, a handheld device may provide a haptic feedback in response to the rhythm of music, so as to allow a user to get into the music and have more fun. People who are interested in the relevant arts can refer to the following documents: U.S. Pat. No. 6,703,550; U.S. Pat. No. 7,979,146 (also published as EPO patent application EP2166432); U.S. Pat. No. 8,441,437 (also published as PCT patent application WO2003032289); US patent application 20120306631; US patent application 20070145857 (also published as PCT patent application WO2007078967); US patent application 20110075835 (also published as EPO patent application EP2484104); and J. M. Lim, J. U. Lee, K. U. Kyung, and J. C. Ryou, "An Audio-Haptic Feedbacks for enhancing User Experience in Mobile Devices", in 2013 IEEE International Conference on Consumer Electronics (ICCE).

The above-mentioned prior arts having haptic feedback function in the audio field face at least the following problem: when the battery of a handheld device falls short of power, the haptic effect will be degraded as the power goes down, which consequently erodes user experience.

SUMMARY OF THE INVENTION

In view of the problems of the prior art, an object of the present invention is to provide an audio device and audio utilization method capable of compensating a haptic effect according to a power measuring result and an audio signal, so as to make the haptic effect stay within an expectation.

The present invention discloses an audio device having haptic compensation function capable of compensating a haptic effect according to a power measuring result and an audio signal. An embodiment of this audio device comprises: an audio signal generating circuit operable to generate an audio signal; a power measuring circuit operable to measure a remaining electric quantity of a power source and thereby generate a power measuring result; and a haptic compensating circuit, coupled to the audio signal generating circuit and the power measuring circuit, operable to adjust a gain of the audio signal or the derived signal thereof according to the power measuring result and thereby output a haptic compensation signal which is used to compensate a haptic effect.

The present invention also discloses an audio utilization method having haptic compensation function carried out by an audio device and capable of compensating a haptic effect according to a power measuring result and an audio signal. An embodiment of this audio utilization method comprises the following steps: receiving an audio signal from an audio source; measuring an electric quantity of a power source and thereby generating a power measuring result; and adjusting the gain of the audio signal or the derived signal thereof according to the power measuring result and then outputting a haptic compensation signal which is used to compensate the haptic effect.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description uses language by referring to terms common in this invention field. If any term is defined in this specification, such term should be explained accordingly. Besides, the connection between objects or events in the disclosed embodiments can be direct or indirect provided that these embodiments are still applicable under such connection. Said "indirect" means that an intermediate object or a physical space is existed between the objects, or an intermediate event or a time interval is existed between the events. Furthermore, each embodiment in the following description includes one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The present invention includes an audio device and audio utilization method capable of compensating a haptic effect according to a power measuring result and an audio signal, so as to maintain the haptic effect regardless of the variation of battery power. The circuit and method are applicable to an integrated circuit (e.g. an audio coder/decoder (codec)) or a system device (e.g. a portable music player). Provided that an alternative means is available and suitable, people of ordinary skill in the art can use such means similar or equivalent to those described in this specification to carry out the present invention, which implies that the scope of this invention is not limited to the embodiments in this specification. On account of that some element of the audio device of the present invention could be known, the detail of such element will be omitted if this omission nowhere dissatisfies the specification and enablement requirements. Besides, the audio utilization method can be in the form of firmware and/or software which can be carried out by the audio device of the present invention or its equivalent; therefore, as long as the remaining disclosure is still enough for understanding and enablement, the following description will abridge the hardware details for carrying out the method, but put the emphasis on the steps.

Figure 1:
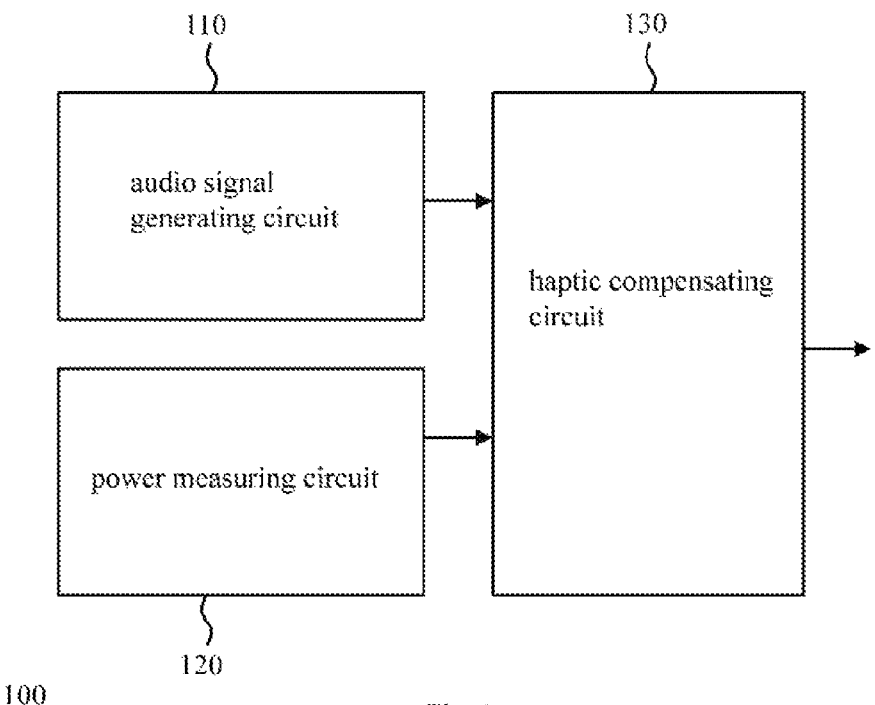
FIG. 1 illustrates an embodiment of the audio device of the present invention.

Please refer to FIG. 1 which illustrates an embodiment of the audio device of the present invention having haptic compensation function. This embodiment is capable of measuring the remaining power of a power source to thereby generate a power measuring result, and then compensating a haptic effect according to the power measuring result and an audio signal, so that the haptic effect will be constant or stable regardless of the variation of the remaining power. In this embodiment, the power source is a battery or some impermanent power source. Therefore, when the electric quantity of this power source goes down, the amplitude of said audio signal may go down correspondingly, and the haptic effect (e.g. vibration effect) is supposed to go down as well; however, the audio device of the present invention can compensate the haptic effect for the decrease of power. Besides, as the remaining power goes down, the volume in response to the audio signal could be kept stable or constant through some compensation mechanism; meanwhile the audio device of this embodiment will compensate the haptic effect to make it stable or unchanged in accordance with the volume. As it is shown in FIG. 1, the audio device 100 having haptic compensation function comprises: an audio signal generating circuit 110, which could be an audio codec or its equivalent and is able to connect with an audio interface for receiving the audio signal (or its source signal) therefrom, operable to generate an audio signal; a power measuring circuit 120 operable to measure a remaining electric quantity of a power source and thereby generate a power measuring result; and a haptic compensating circuit 130, coupled to the audio signal generating circuit 110 and the power measuring circuit 120, operable to adjust a gain of the audio signal or the derived signal thereof (e.g. a filtered signal derived from the audio signal) according to the power measuring result and thereby output a haptic compensation signal which is used to compensate the haptic effect.

In this embodiment, the power measuring circuit 120 is a voltage meter capable of measuring the voltage of said power source (e.g. a battery voltage) and thereby generating the power measuring result. For instance, the voltage meter includes a comparing circuit and a switching circuit. Said comparing circuit is coupled to the power source (e.g. a battery) and coupled to a plurality of comparison voltages by the switching circuit; through the control over the switching circuit, the comparing circuit is operable to compare the voltage of the power source with at least one of the comparison voltages, so as to generate the power measuring result accordingly. To be more specific; the plurality of comparison voltages define a plurality of voltage ranges; the comparing circuit will find out which voltage range the voltage of the power source falls within, and thereby generate the power measuring result for the haptic compensating circuit 130 to make use of it. For example, if the power measuring result indicates that a battery voltage (i.e. the voltage of the power source) falls within a first voltage range among the plurality of voltage ranges, the haptic compensating circuit 130 will adjust the gain of the audio signal or the derived signal thereof by a first grade according to the power measuring result; and if the power measuring result indicates that the battery voltage falls within a second voltage range among the plurality of voltage ranges, the haptic compensating circuit 130 will adjust the gain of the audio signal or the derived signal thereof by a second grade according to the power measuring result in which the first and second grades are different.

In addition to the above-described voltage meter, the present invention may use a current meter to generate the power measuring result provided that the whole invention remains workable. For instance, said current meter may determine the current variation of the power source through a resistance connected with the power supply path of the power source in parallel, so as to generate the power measuring result for a following procedure. In fact, no matter how the power measuring result is generated, as long as the power measuring result reflects that an electric quantity variation of the power source reaches a predetermined threshold, the haptic compensating circuit 130 will be allowed to adjust the gain of said audio signal or its equivalent according to the power measuring result, so as to compensate the haptic effect. In general, if the power measuring result indicates that the decrease of the electric quantity reaches a predetermined threshold, the haptic compensating circuit 130 will raise the gain of the audio signal or the derived signal thereof according to the power measuring result, so that the haptic effect will be kept stable or constant even though the electric quantity goes down.

Figure 2:
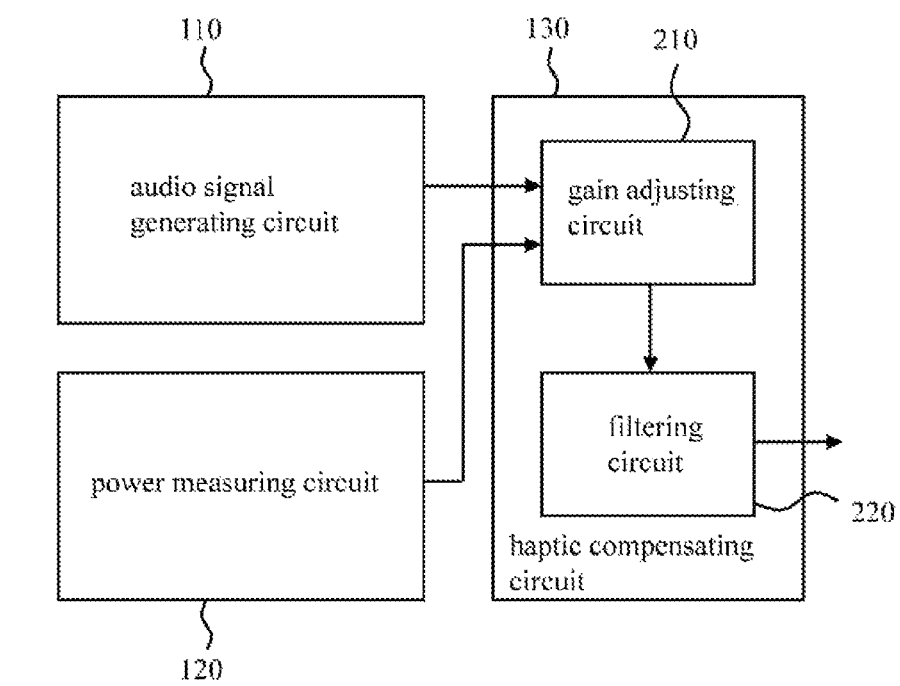
FIG. 2 illustrates an embodiment of the haptic compensating circuit of FIG. 1.
Figure 3:
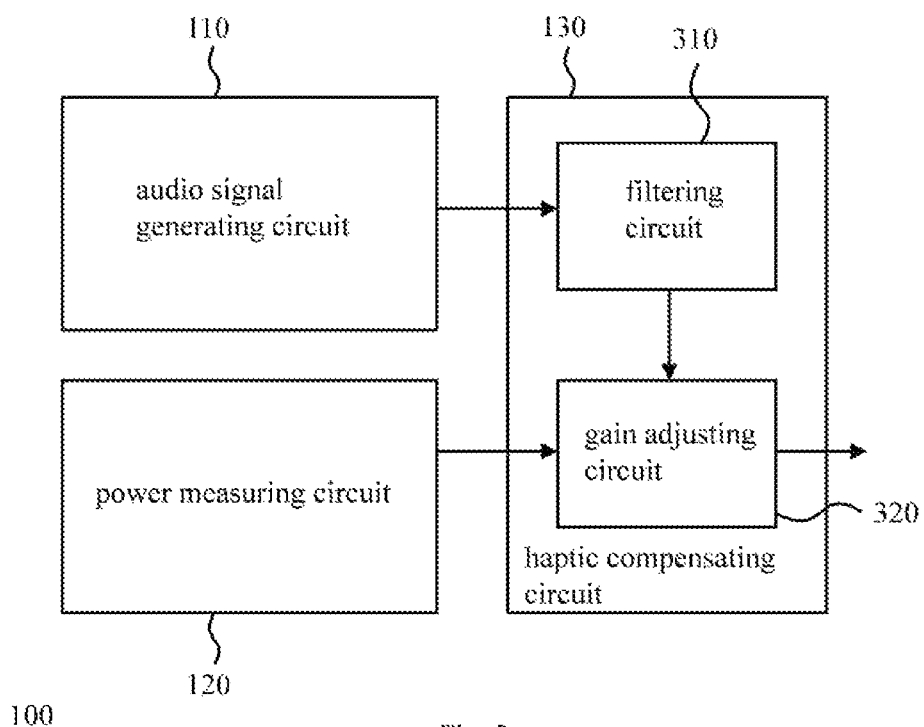
FIG. 3 illustrates another embodiment of the haptic compensating circuit of FIG. 1.

Please refer to FIG. 1 again. In this embodiment, the haptic compensating circuit 130 first adjusts the gain of the audio signal according to the power measuring result, and then generates the haptic compensation signal. For instance, please refer to FIG. 2. The haptic compensating circuit 130 includes: a gain adjusting circuit 210, coupled to the audio signal generating circuit 110 and the power measuring circuit 120, operable to adjust the gain of the audio signal according to the power measuring result and consequently generate a gain adjustment signal; and a filtering circuit 220 (e.g. a low pass filter), coupled to the gain adjusting circuit 210, operable to generate the haptic compensation signal according to the gain adjustment signal, wherein the filtering bandwidth of said filtering circuit 220 could be determined by those of ordinary skill in the art in accordance with their demand or some design specification. In an alternative embodiment, the haptic compensating circuit 130 may first generate a filtered signal according to the audio signal and then generate the haptic compensation signal by adjusting the filtered signal according to the power measuring result. For instance, please refer to FIG. 3. The haptic compensating circuit 130 here comprises: a filtering circuit 310 (e.g. a low pass filter), coupled to the audio signal generating circuit 110, operable to generate a filtered signal; and a gain adjusting circuit 320, coupled to the filtering circuit 310 and the power measuring circuit 120, operable to adjust the filtered signal according to the power measuring result and then generate the haptic compensation signal.

Figure 4A:
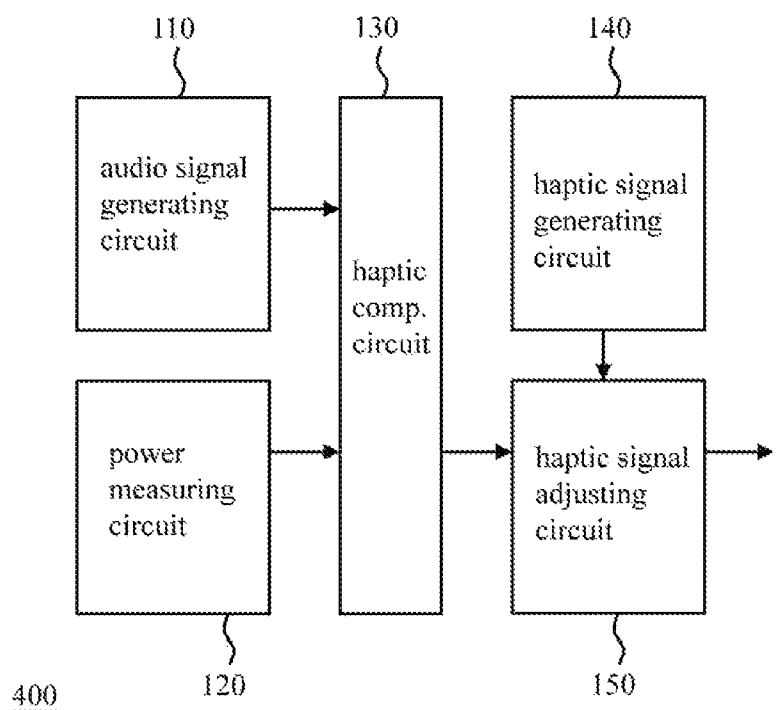
FIG. 4a illustrates another embodiment of the audio device of the present invention.
Figure 4B:
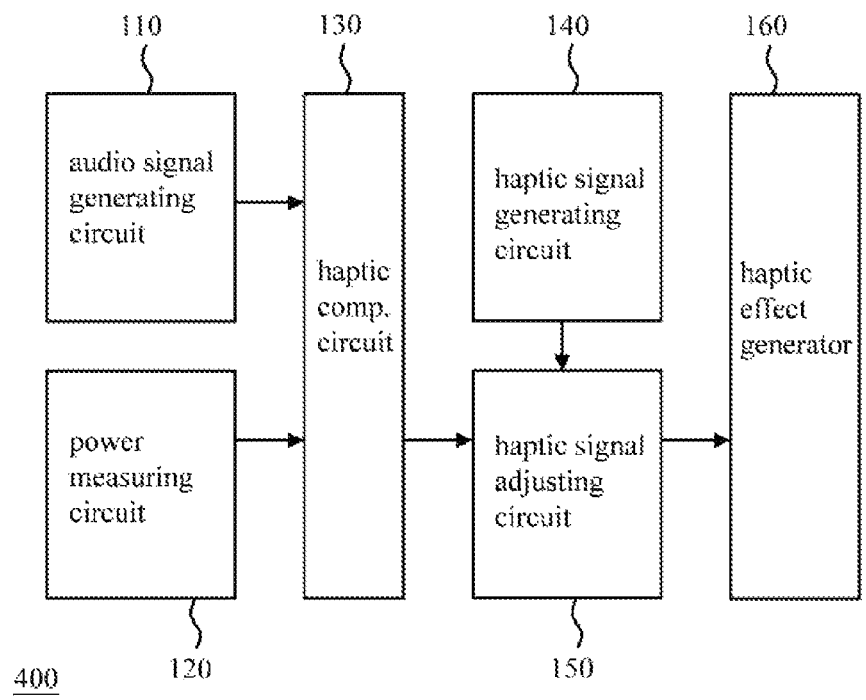
FIG. 4b illustrates the audio device of FIG. 4a in company with a haptic effect generator.

Please refer to FIG. 4a which illustrates another embodiment of the audio device of the present invention. Compared with the embodiment of FIG. 1, this embodiment integrates the elements of FIG. 1 with an element capable of determining the haptic effect. As it is shown in FIG. 4a, in addition to the elements of FIG. 1, the audio device 400 further comprises: a haptic signal generating circuit 140 such as a known or self-designed haptic driver operable to generate a haptic driving signal; and a haptic signal adjusting circuit 150, coupled to the haptic signal generating circuit 140 and the haptic compensating circuit 130 (i.e. haptic comp. circuit in the FIGS.), operable to adjust the haptic driving signal according to the haptic compensation signal and therefore generate a haptic adjustment signal which is used as a basis of generating the haptic effect. Said haptic signal adjusting circuit 150 could be a gain control circuit, might be integrated in the haptic signal generating circuit 140 or independent of it, and is operable to adjust the gain of the haptic driving signal according to the haptic compensation signal and consequently generate the haptic adjustment signal. Besides, as it is shown in FIG. 4b, the audio device 400 could further include a haptic effect generator 160 which is coupled to the haptic signal adjusting circuit 150 and operable to provide the haptic effect in accordance with the haptic adjustment signal. This haptic effect generator 160 could be a piezoelectric actuator, a linear resonant actuator, an electric rotating mass (ERM) element, or any other known/self-designed haptic effect generator. Since each of the haptic signal generating circuit 140, the haptic signal adjusting circuit 150 and the haptic effect generator 160 by itself is known in this field, the detail thereof having little or nothing to do with the features of the present invention is therefore omitted.

Figure 5A:
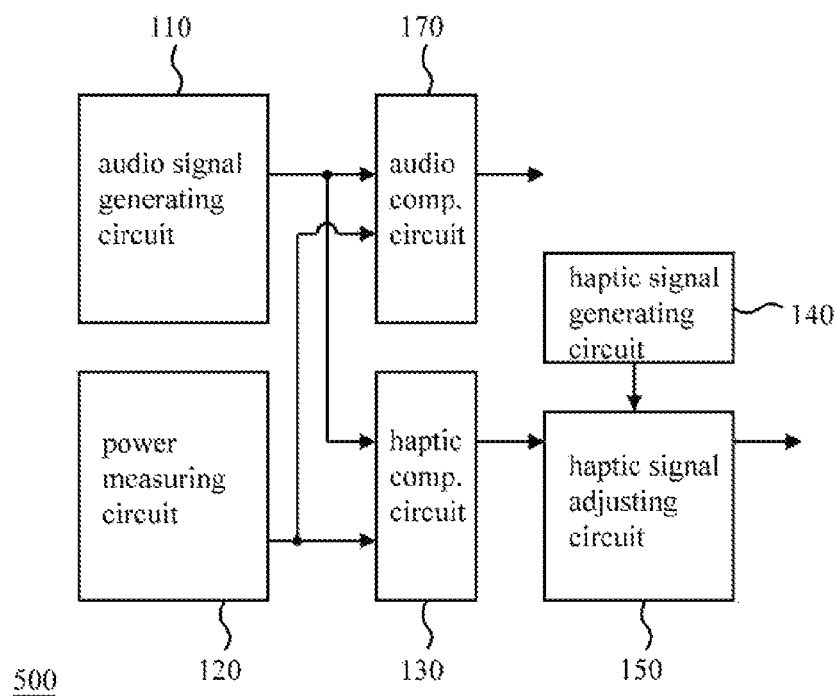
FIG. 5a illustrates a further embodiment of the audio device of the present invention.

Please refer to FIG. 5a which illustrates a further embodiment of the audio device of the present invention. Compared to the embodiment of FIG. 4a, the audio device 500 in this embodiment further comprises: an audio compensating circuit 170 (i.e. the audio comp. circuit in the FIGS.), coupled to the audio generating circuit 110 and the power measuring circuit 120, operable to adjust the gain of the audio signal according to the power measuring result, so as to generate an audio compensation signal for constant or stable sound playing. Said audio compensating circuit 170 could be the gain adjusting circuit 210 of FIG. 2; if so, the audio compensation signal will be equivalent to the foresaid gain adjustment signal. However, said audio compensating circuit 170 could be another gain adjusting circuit operable to adjust the gain of the audio signal according to the power measuring result and some related audio setting. Additionally, please refer to FIG. 5b which illustrates the audio device 500 of FIG. 5b in company with a speaker 180. This speaker is coupled with the audio compensating circuit 170 and operable to carry out sound broadcast in accordance with the audio compensation signal.

Figure 6:
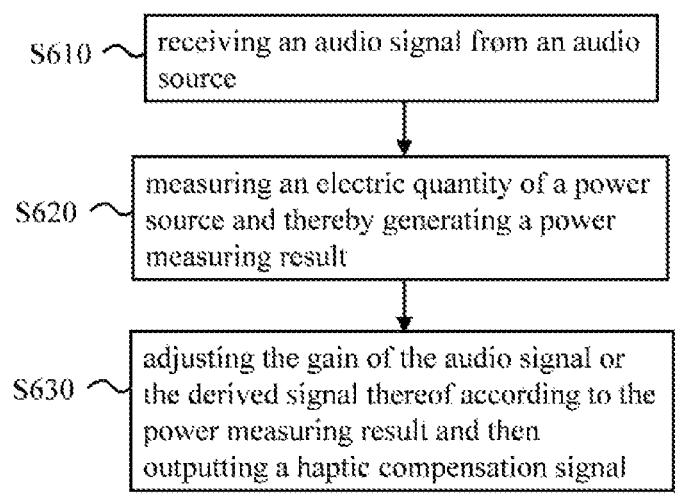
FIG. 6 illustrates an embodiment of the audio utilization method of the present invention.

In addition to the above-disclosed audio device, the present invention also discloses an audio utilization method capable of haptic compensation as follows. This method could be carried out by the audio device of the present invention or the equivalent thereof, and is capable of compensating a haptic effect in accordance with a power measuring result and an audio signal, which thereby keeps the haptic effect stable or constant regardless of the variation of remaining power. As it is shown in FIG. 6, an embodiment of the audio utilization method comprises the following steps:

Step S610: receiving an audio signal from an audio source. This step could be carried out by the audio signal generating circuit 110 of FIG. 1 or its equivalent.

Step S620: measuring an electric quantity of a power source and thereby generating a power measuring result. In this embodiment, the power source is a battery or some impermanent power source, and this step could be carried out by the power measuring circuit 120 of FIG. 1 or its equivalent. More implementation detail or modifications could be found in the preceding paragraphs.

Step S630: adjusting the gain of the audio signal or the derived signal thereof according to the power measuring result and then outputting a haptic compensation signal which is used to compensate a haptic effect. This step could be carried out by the haptic compensating circuit 130 of FIG. 1 or its equivalent in a plurality of manners. For instance, one manner includes the steps of: adjusting the gain of the audio signal according to the power measuring result and thereby generating a gain adjustment signal, and then generating a filtered signal (e.g. a low pass filtered signal) as the haptic compensation signal according to the gain adjustment signal; and another manner includes the steps of: generating a filtered signal (e.g. a low pass filtered signal) according to the audio signal, and afterwards adjusting the gain of the filtered signal according to the power measuring result, so as to generate the haptic compensation signal.

Figure 7:
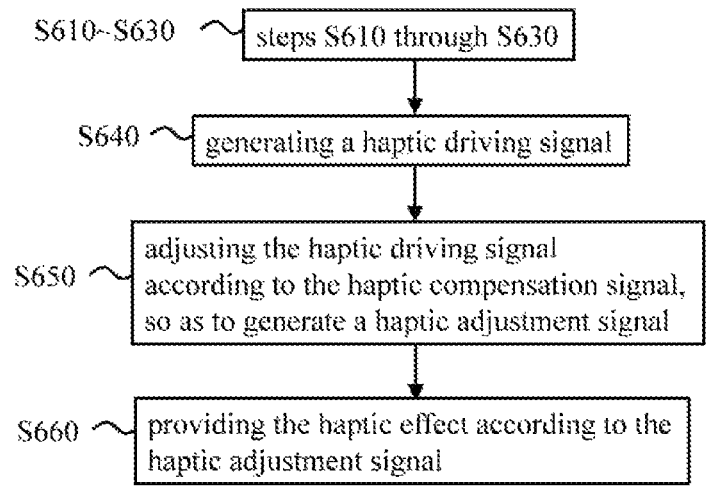
FIG. 7 illustrates another embodiment of the audio utilization method of the present invention.

As it is shown in FIG. 7, the above-described embodiment may further comprise the following steps:

Step S640: generating a haptic driving signal. This step could be carried out by the haptic signal generating circuit 140 of FIG. 4a or its equivalent.

Step S650: adjusting the haptic driving signal according to the haptic compensation signal, so as to generate a haptic adjustment signal. This step could be carried out by the haptic signal adjusting circuit 150 of FIG. 4a or its equivalent.

Besides, this embodiment may additionally comprise the following step:

Step S660: providing the haptic effect according to the haptic adjustment signal. This step could be carried out by the haptic effect generator 160 of FIG. 4b or its equivalent.

Figure 8:
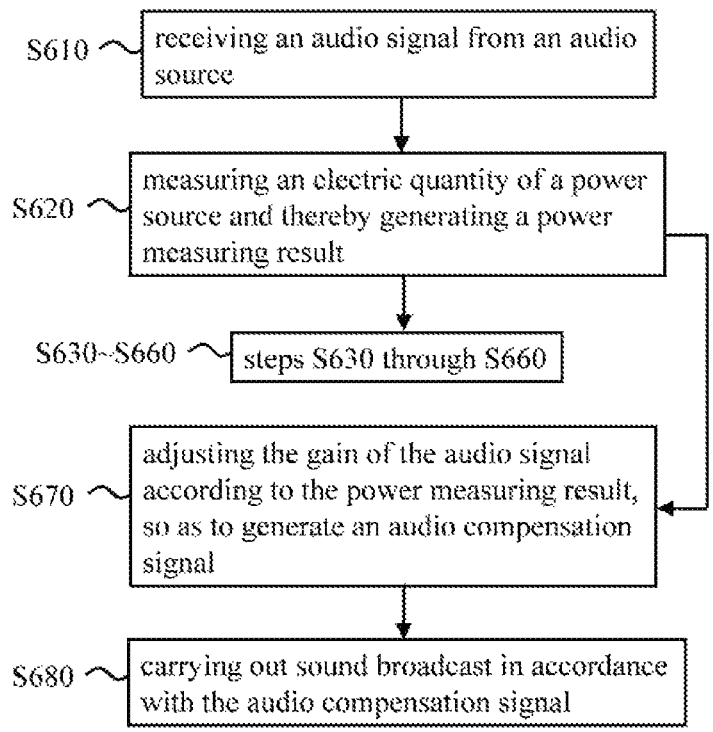
FIG. 8 illustrates a further embodiment of the audio utilization method of the present invention.

The present method invention is not only able to adjust the haptic effect according to the power measuring result, but also able to compensate the foresaid audio signal according to the power measuring result, as so to make the volume dependent on the compensated audio signal free from the variation of remaining power. To be more specific. As it is shown in FIG. 8, this method may include the following step:

Step S670: adjusting the gain of the audio signal according to the power measuring result, so as to generate an audio compensation signal. This step could be carried out by the audio compensating circuit 170 of FIG. 5a or its equivalent.

Figure 5B:
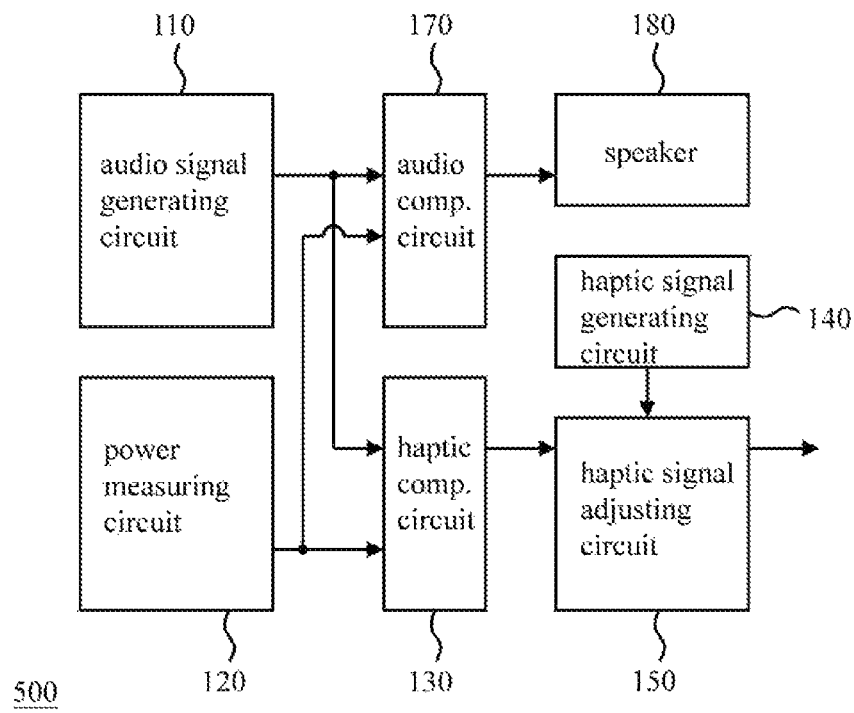
FIG. 5b illustrates the audio device of FIG. 5a in accompany with a speaker.

Moreover, this method may further execute the following step by the speaker 180 of FIG. 5b or its equivalent:

Step S680: carrying out sound broadcast in accordance with the audio compensation signal.

Since those of ordinary skill in the art can appreciate the implementation detail and modifications of the present method in light of the discussion about the device invention of FIG. 1 through FIG. 5b, repeated and redundant description is therefore omitted provided that the remaining disclosure is still enough for understanding and enablement. Please note that there is no specific order for executing the steps of FIG. 6 through FIG. 8 as long as the whole invention is still workable.

To sum up. The audio device and audio utilization method of the present invention are able to maintain a haptic effect at a prescribed level in accordance with a power measuring result and an audio signal, so that the haptic effect will be stable or predictable regardless of remaining power. In brief, even though the remaining power varies with time, the present invention can still promise users similar haptic experience.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An audio device for compensating a haptic effect according to a power measuring result and an audio signal, comprising:
   an audio signal generating circuit configured to generate the audio signal;
   a power measuring circuit configured to measure a remaining electric quantity of a power source and thereby generate the power measuring result; and
   a haptic compensating circuit, coupled to the audio signal generating circuit and the power measuring circuit, configured to adjust a gain of the audio signal or the derived signal thereof according to the power measuring result and thereby output a haptic compensation signal which is used to compensate the haptic effect.

2. The audio device of claim 1, wherein the haptic compensating circuit includes:
   a gain adjusting circuit, coupled to the audio signal generating circuit and the power measuring circuit, configured to adjust the gain of the audio signal and thereby generate a gain adjustment signal; and
   a filtering circuit, coupled to the gain adjusting circuit, configured to generate the haptic compensation signal according to the gain adjustment signal.

3. The audio device of claim 1, wherein the haptic compensating circuit includes:
   a filtering circuit, coupled to the audio signal generating circuit, configured to generate a filtered signal according to the audio signal; and
   a gain adjusting circuit, coupled to the filtering circuit and the power measuring circuit, configured to adjust the gain of the filtered signal according to the power measuring result and thereby generate the haptic compensation signal.

4. The audio device of claim 1, further comprising:
   a haptic signal generating circuit configured to generate a haptic driving signal; and
   a haptic signal adjusting circuit, coupled to the haptic signal generating circuit and the haptic compensating circuit, configured to adjust the haptic driving signal according to the haptic compensation signal and therefore generate a haptic adjustment signal which is used as a basis of generating the haptic effect.

5. The audio device of claim 4, further comprising:
   a haptic effect generator, coupled to the haptic signal adjusting circuit, configured to generate the haptic effect according to the haptic adjustment signal.

6. The audio device of claim 1, further comprising:
   an audio compensating circuit, coupled to the audio generating circuit and the power measuring circuit, configured to adjust the gain of the audio signal according to the power measuring result, so as to generate an audio compensation signal.

7. The audio device of claim 1, wherein the power source includes a battery configured to provide a battery voltage, and the power measuring circuit includes:
   a comparing circuit, coupled to the battery voltage and a plurality of comparison voltages, configured to compare the battery voltage with at least one of the comparison voltages and generate the power measuring result accordingly.

8. The audio device of claim 7, wherein the plurality of comparison voltages define a plurality of voltage ranges; if the power measuring result indicates that the battery voltage falls within a first voltage range among the plurality of voltage ranges, the haptic compensating circuit adjusts the gain of the audio signal or the derived signal thereof by a first grade according to the power measuring result; and if the power measuring result indicates that the battery voltage falls within a second voltage range among the plurality of voltage ranges, the haptic compensating circuit adjusts the gain of the audio signal or the derived thereof by a second grade according to the power measuring result in which the first and second grades are different.

9. The audio device of claim 1, wherein if the power measuring result indicates that an electric quantity variation of the power source reaches a predetermined threshold, the haptic compensating circuit adjusts the gain of the audio signal or the derived signal thereof according to the power measuring result, so as to compensate the haptic effect.

10. The audio device of claim 1, wherein if the power detection result indicates that the decrease of an electric quantity of the power source reaches a predetermined threshold, the haptic compensating circuit raises the gain of the audio signal or the derived signal thereof according to the power measuring result, so as to keep the haptic effect stable or constant during the electric quantity of the power source going down.

11. An audio utilization method carried out by an audio device for compensating a haptic effect according to a power measuring result and an audio signal, comprising:
    receiving the audio signal from an audio source; measuring an electric quantity of a power source and thereby generating the power measuring result; and
    adjusting the gain of the audio signal or the derived signal thereof according to the power measuring result and then generating a haptic compensation signal which is used to compensate the haptic effect.

12. The audio utilization method of claim 11, wherein the step of generating the haptic compensation signal includes:
    adjusting the gain of the audio signal according to the power measuring result and thereby generating a gain adjustment signal; and
    generating a filtered signal as the haptic compensation signal in accordance with the gain adjustment signal.

13. The audio utilization method of claim 11, wherein the step of generating the haptic compensation signal includes:
    generating a filtered signal according to the audio signal; and
    adjusting the gain of the filtered signal according to the power measuring result and therefore generating the haptic compensation signal.

14. The audio utilization method of claim 11, further comprising:
    generating a haptic driving signal; and
        adjusting the haptic driving signal according to the haptic compensation signal and thus generating a haptic adjustment signal which is used as the basis of generating the haptic effect.

15. An audio device for compensating a haptic effect according to a power measuring result and an audio signal, comprising:
    an audio signal generating circuit configured to generate the audio signal;
    a power measuring circuit configured to measure a remaining electric quantity of a power source and thereby generate the power measuring result; and
    a haptic compensating circuit, coupled to the audio signal generating circuit and the power measuring circuit, configured to raise a gain of the audio signal or the derived signal thereof when the power measuring result indicates that the remaining electric quantity of the power source decreases and reaches a predetermined threshold and thereby output a haptic compensation signal which is used to compensate the haptic effect.

16. The audio device of claim 15, wherein the haptic compensating circuit includes:
   a gain adjusting circuit, coupled to the audio signal generating circuit and the power measuring circuit, configured to adjust the gain of the audio signal and thereby generate a gain adjustment signal; and
   a filtering circuit, coupled to the gain adjusting circuit, configured to generate the haptic compensation signal according to the gain adjustment signal.

17. The audio device of claim 15, wherein the haptic compensating circuit includes:
   a filtering circuit, coupled to the audio signal generating circuit, configured to generate a filtered signal according to the audio signal; and
   a gain adjusting circuit, coupled to the filtering circuit and the power measuring circuit, configured to adjust the gain of the filtered signal according to the power measuring result and thereby generate the haptic compensation signal.

18. The audio device of claim 15, further comprising:
   a haptic signal generating circuit configured to generate a haptic driving signal; and
   a haptic signal adjusting circuit, coupled to the haptic signal generating circuit and the haptic compensating circuit, configured to adjust the haptic driving signal according to the haptic compensation signal and therefore generate a haptic adjustment signal which is used as a basis of generating the haptic effect.

19. The audio device of claim 15, further comprising:
   an audio compensating circuit, coupled to the audio generating circuit and the power measuring circuit, configured to adjust the gain of the audio signal according to the power measuring result, so as to generate an audio compensation signal.

20. The audio device of claim 15, wherein the power source includes a battery configured to provide a battery voltage, and the power measuring circuit includes:
   a comparing circuit, coupled to the battery voltage and a plurality of comparison voltages, configured to compare the battery voltage with at least one of the comparison voltages and generate the power measuring result accordingly.

* * * * *